United States Patent
Zhang

(10) Patent No.: US 9,240,562 B2
(45) Date of Patent: Jan. 19, 2016

(54) OTFT ARRAY SUBSTRATE, DISPLAY DEVICE AND METHOD FOR MANUFACTURING THE SAME

(71) Applicant: BOE TECHNOLOGY GROUP CO., LTD., Beijing (CN)

(72) Inventor: Xuehui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 48 days.

(21) Appl. No.: 13/824,651

(22) PCT Filed: Nov. 15, 2012

(86) PCT No.: PCT/CN2012/084696
§ 371 (c)(1),
(2) Date: Mar. 18, 2013

(87) PCT Pub. No.: WO2013/127197
PCT Pub. Date: Sep. 6, 2013

(65) Prior Publication Data
US 2014/0054565 A1    Feb. 27, 2014

(30) Foreign Application Priority Data
Feb. 27, 2012    (CN) .......................... 2012 1 0046964

(51) Int. Cl.
*H01L 27/28*    (2006.01)
*H01L 51/05*    (2006.01)
*H01L 51/10*    (2006.01)

(52) U.S. Cl.
CPC .......... *H01L 51/0516* (2013.01); *H01L 27/283* (2013.01); *H01L 51/0545* (2013.01); *H01L 51/102* (2013.01)

(58) Field of Classification Search
USPC ............................................ 257/40, E51.006
IPC ........................ H01L 27/3274,27/283, 51/0545
See application file for complete search history.

(56) References Cited

U.S. PATENT DOCUMENTS 6,380,559 B1 * 4/2002 Park et al. ........................ 257/59
2003/0104232 A1 * 6/2003 Kihara et al. ............... 428/473.5
(Continued)

FOREIGN PATENT DOCUMENTS

| CN | 1905203 A | 1/2007 |
| CN | 1945845 A | 4/2007 |

(Continued)

OTHER PUBLICATIONS

Second Chinese Office Action dated Aug. 5, 2014; Appln. No. 201210046964.0.

(Continued)

*Primary Examiner* — Marcos D Pizarro
(74) *Attorney, Agent, or Firm* — Ladas & Parry LLP

(57) ABSTRACT

According to embodiments of the present invention, there are disclosed an organic thin film transistor (OTFT) array substrate, a display device and a method for manufacturing the same, which are capable of improving quality of a channel. The OTFT array substrate comprises: a transparent substrate, a gate line and a data line which are formed on the transparent substrate, and a pixel unit which are defined by crossing of the gate line and the data line; the pixel unit including an organic thin film transistor (OTFT) and a pixel electrode; on a channel region of an active layer of the OTFT, there is provided a first passivation layer unit.

13 Claims, 7 Drawing Sheets

(56) References Cited

U.S. PATENT DOCUMENTS

2007/0057252 A1    3/2007   Hsieh et al.
2007/0212807 A1*   9/2007   Yamada et al. .............. 438/99
2007/0252142 A1   11/2007   Yoon
2008/0002124 A1    1/2008   Yang
2008/0002125 A1*   1/2008   Kim ............................ 349/140

FOREIGN PATENT DOCUMENTS

| CN | 101097320 A | 1/2008 |
| CN | 101105615 A | 1/2008 |
| CN | 102655154 A | 9/2012 |

OTHER PUBLICATIONS

International Preliminary Report on Patentability dated Sep. 2, 2014; PCT/CN2012/084696.

International Search Report; Jan. 31, 2013; PCT/CN2012/084696.

First Chinese Office Action dated Feb. 21, 2014; Appln. No. 201210046964.0.

Chinese Rejection Decision Appln. No. 201210046964.0; Dated Nov. 3, 2014.

\* cited by examiner

OTFT ARRAY SUBSTRATE, DISPLAY DEVICE AND METHOD FOR MANUFACTURING THE SAME

TECHNICAL FIELD

Embodiments of the present invention relate to an OTFT array substrate, a display device and a method for manufacturing the same.

BACKGROUND

An organic thin film transistor (OTFT) is a logic unit device employing an organic semiconductor for an active layer. As compared to an inorganic transistor, the OTFT has the following main advantages. (1) There are more film technologies for forming an organic thin film, such as Langmuir-Blodgett (LB) technology, molecular self-assembly technology, vacuum evaporation, ink-jet printing, and so on, and thereby the manufacturing process can be made to be simple, diversified, and at a low cost; (2) organic materials are easy to be obtained; (3) the manufacturing process of the OTFT can be more simple, does not require strict regulation on ambient conditions, and does not have a harsh requirement on purity, and thus costs of a device can be reduced effectively, and the device has characteristics of being suitable for large-area processing, flexible substrate compliance, and low costs for process. Owing to the above merits, the OTFT holds promising application prospective in the field of flat panel displays.

However, in accordance with the manufacturing process of an OTFT at present, in the course of producing a conductive thin film on an active layer and patterning the conductive thin film with a photolithography process (i.e., in the course of producing a first contact layer unit, a second contact layer unit, and source and drain electrodes), a portion in the active layer functioning as a channel may be damaged to a certain degree; the quality of the channel directly affects the quality of the OTFT, and in turn, the quality of a display panel is affected.

SUMMARY

According to embodiments of the invention, there are provided an OTFT array substrate, a display device and a method for manufacturing the same for improving quality of a channel.

In an aspect of the invention, there is provided an OTFT array substrate, comprising: a transparent substrate, gate lines and data lines which are formed on the transparent substrate, and a plurality of pixel units which are defined by crossing of the gate lines and the data lines, each of the pixel units including an organic thin film transistor (OTFT) and a pixel electrode; on a channel region of an active layer of the OTFT, there is provided a first passivation layer unit.

In another aspect of the invention, there is provided a display device, comprising the above OTFT array substrate.

In still another aspect of the invention, there is provided a method for manufacturing an OTFT array substrate, comprising: depositing a gate metal thin film, a gate insulating layer thin film and an organic semiconductor thin film on a transparent substrate sequentially, forming a pattern of a gate line and a pattern of a gate electrode, a gate insulating layer and an active layer of an OTFT which are uniform in shape through a first patterning process; forming a passivation layer thin film on the transparent substrate subjected to the first patterning process, and forming a pattern of a first passivation layer unit and a second passivation layer unit through a second patterning process; depositing a transparent conductive thin film, and a source-drain metal thin film sequentially on the transparent substrate subjected to the second patterning process in sequence, and through a third patterning process, forming a pattern of a source electrode and a drain electrode of the OTFT and a data line with the source-drain metal thin film, and forming a pattern of a first contact layer unit under the source electrode of the OTFT, a second contact layer unit under the drain electrode of the OTFT, a third contact layer unit under the data line and a pixel electrode which is directly connected to the second contact layer unit with the transparent conductive thin film.

According to the OTFT array substrate, the display device and the method for manufacturing the same provided by embodiments of the invention, on the channel region of the active layer of the OTFT, there is provided a first passivation layer unit, which functions to protect the channel region of the active layer during manufacture and patterning of the conductive thin film, and therefore the channel region will not be damaged. The size of the channel region can be controlled precisely by the first passivation layer unit. Thus, the quality of the channel is improved.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative or the invention.

REFERENCE NUMERALS

1—transparent substrate, 2—gate electrode, 3—gate insulating layer, 4—active layer, 51—first passivation layer unit, 52—second passivation layer unit, 61—first contact layer unit, 62—pixel electrode, 63—second contact layer unit, 7—drain electrode, 8—photoresist, 9—source electrode, 10—data line, 64—third contact layer unit.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. Tunis such as "first", "second" and the like used in the specification and claims of the patent application of the invention do not show any order, number or importance, but are only used to distinguish different constituent parts. Likewise, a term "a," "an," "the" or the like does not indicate limitation in number, but specifies the presence of at least one. Terms such as "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship is also changed accordingly.

Figure 1:
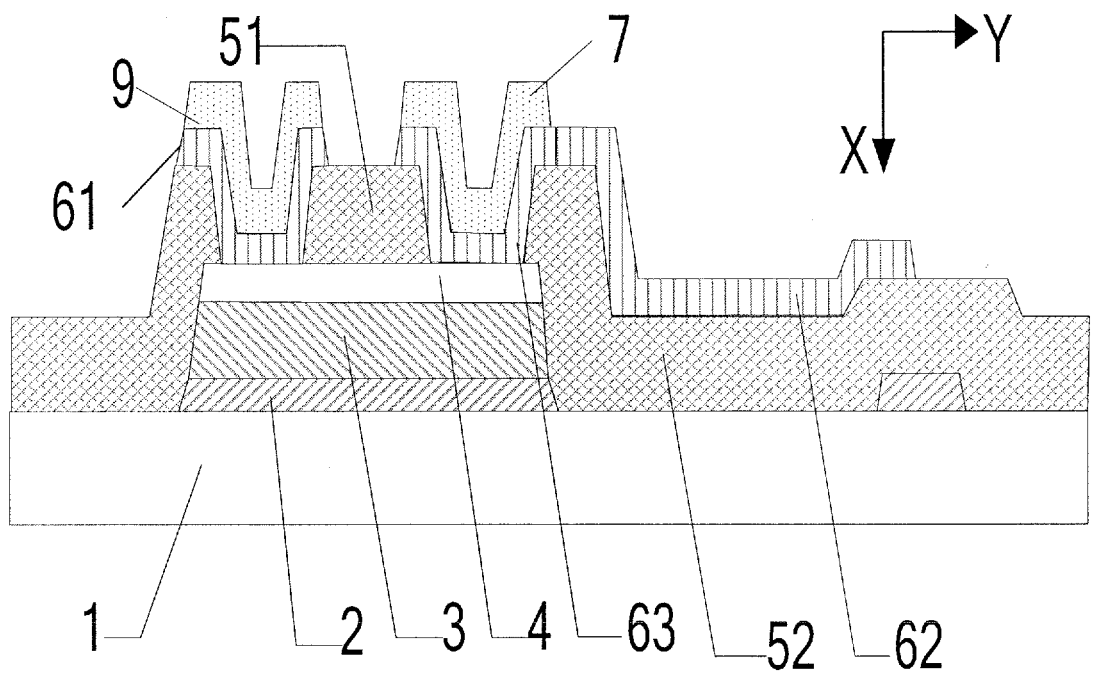
FIG. 1 is a structurally schematic view showing an OTFT array substrate provided by an embodiment of the invention.

According to the invention, there is provided an OTFT array substrate. As shown in FIG. 1, the OTFT array substrate comprises: a transparent substrate 1, a plurality of gate lines and a plurality of data lines which are formed on the transparent substrate 1, and a plurality of pixel units which are for example arranged in an array and are defined by crossing of the gate lines and data lines. Each of the pixel units includes an organic thin film transistor (OTFT) and a pixel electrode 62; and on a channel region of an active layer 4 of the OTFT, there is provided a first passivation layer unit 51. The following descriptions are made with respect to a single pixel unit or a plurality of pixel units on the array substrate, and other pixel unit(s) can be formed in a same way.

In the above OTFT array substrate, on the cannel region of the active layer 4 of the OTFT, the first passivation layer unit 51 is provided, and so the channel part of the active layer 4 can be protected from being damaged in the course of patterning a conductive thin film. Moreover, a size of the channel region can be determined by the size of the first passivation layer, and the precision of the channel region can be enhanced; therefore the quality of a channel can be improved.

Further, as shown in FIG. 1, in the above OTFT array substrate, a gate electrode 2, a gate insulating layer 3 and the active layer 4 of the OTFT are uniform in shape, that is, they are of substantially a same size. The OTFT array substrate further comprises a second passivation layer unit 52; and the second passivation layer unit 52 at least covers edges of the stack of the gate electrode 2, the gate insulating layer 3 and the active layer 4 of the OTFT which are uniform in shape.

For example, the gate electrode 2, the gate insulating layer 3 and the active layer 4 are patterned in one patterning process, so that they are uniform in shape with respect to each other. Here, one patterning process refers to a process in which patterning is realized by using one mask plate. Because the second passivation layer unit 52 at least covers edges of the gate electrode 2, the gate insulating layer 3 and the active layer 4 of the OTFT, electric connections between the gate electrode 2 and first and second contact layer units 61 and 62 are avoided. Preferably, the second passivation layer unit 52 also covers a common electrode line, so that there is no electric connection between the pixel electrode and a common electrode. The first passivation layer unit 51 covers the channel region of the active layer 4, and this makes the first contact layer unit 61 and the second contact layer unit 63 being shown in a U shape as a whole, as shown in FIG. 1.

Preferably, the first passivation layer unit 51 and the second passivation layer unit 52 are different patterns formed by a same layer of thin film.

Regarding the material for the first passivation layer unit 51 and the second passivation layer unit 52, a material commonly used in prior art may be used, such as silicon nitride, and it is patterned through a photolithography and etching process. In the embodiment of the invention, preferably, the material for the first passivation layer unit 51 and/or the second passivation layer unit 52 is an organic photosensitive material; and in one patterning process, when the first passivation layer unit 51 and the second passivation layer unit 52 are to be patterned, they have only to be exposed and developed, but do not need to be etched further.

Figure 14:
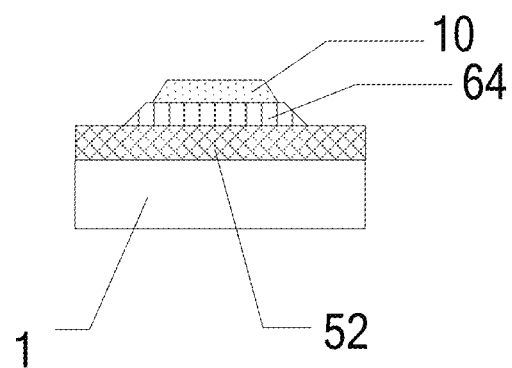
FIG. 14 is a structurally schematic view showing a third contact layer unit in an OTFT array substrate provided by an embodiment of the invention.

Further, in the above OTFT array substrate, in a non-channel region of the active layer of the OTFT, a source electrode 9 of the OTFT is connected to the active layer 4 through the first contact layer unit 61 under the source electrode 9, a drain electrode 7 of the OTFT is connected to the active layer 4 through the second contact layer unit 63 under the drain electrode 7; and under a data line 10, there is formed a third contact layer unit 64, as illustrated in FIG. 14.

Preferably, the first contact layer unit 61, the second contact layer unit 63, the third contact layer unit 64 and the pixel electrode 62 are different patterns formed by a same layer of thin film, and the pixel electrode 62 is directly connected to the second contact layer unit 63, as shown in FIG. 1.

The term "under" is defined in the same direction as an X axis in FIG. 1. The first contact layer unit 61, the second contact layer unit 63, the third contact layer unit 64 and the pixel electrode 62 are different patterns formed by the same layer of thin film, and therefore only one patterning process is needed to connect the pixel electrode 62 to the drain electrode 7, and the number of the patterning process is decreased. Because the drain electrode 7 of the OTFT directly covers the second contact layer unit 63, the pixel electrode 62 is connected to the drain electrode 7 of the OTFT through the second contact layer unit 63.

Further, the first contact layer unit 62 under the source electrode 9 of the OTFT has a larger pattern than the source electrode 9, or they are uniform in pattern. The second contact layer unit 63 under the drain electrode 7 of the OTFT has a larger pattern than the drain electrode 7, or they are uniform in pattern. The third contact layer unit 64 under the data line 10 of the OTFT has a larger pattern than the data line 10, or they are uniform in pattern.

It should be noted that, upon formation of the source and drain electrodes, the data line is formed as well. Because the shape of the data line may not be changed in the embodiment of the invention compared to a traditional structure, and the third contact layer unit and the data line are uniform in shape or the third contact layer unit has a slightly larger shape than the data line, it is not difficult for those skilled in the art to conceive the shape of the data line and the shape of the third contact layer unit. So, the data line and the third contact layer unit are not denoted in the figure.

Preferably, as shown in FIG. 1, in the OTFT array substrate, a thickness of the gate insulating layer 3 of the OTFT is, for example, 200-400 nm, and a thickness of the first passivation layer unit 51 is, for example, 250-650 nm.

The thickness of the gate insulating layer 3 of the OTFT can be in the range of 200-400 nm; a smaller thickness the gate insulating layer 3 has, it is more beneficial to increasing of an on-state current, so that the charging time of a capacitor formed between the active layer 4 and the gate electrode 2 become shorter. The thickness of the first passivation layer 51 may be in the range of 250-650 nm; a larger the thickness the first passivation layer 51 has, the smaller the capacitance between the gate line and the data line is, the less the interference between the gate line and the data line is, and the more the properties of the device can be improved.

According to another embodiment of the invention, there is further provided a display device, comprising the OTFT array substrate as stated above. The display device may be a liquid crystal panel, an electronic paper panel, an OLED panel, a liquid crystal television, a liquid crystal display, a digital photo frame, a cell phone, a tablet computer or any other product or component having a display function.

In the display device provided by the embodiment of the invention, by means of providing the first passivation layer unit on the channel region of the active layer of the OTFT, a function of protecting the channel region of the active layer can be realized, and the size of the channel region can be controlled precisely with the first passivation layer unit, thereby improving the quality of the channel.

According to another embodiment of the invention, there is provided a method for manufacturing an OTFT array substrate, which comprises the following steps.

A1、 A gate metal thin film, a gate insulating layer thin film and an organic semiconductor thin film are deposited on a transparent substrate 1 sequentially, and the pattern of a gate line and the pattern of a gate electrode 2, a gate insulating layer 3 and an active layer 4 of an OTFT, which are uniform in shape, are formed through a first patterning process.

Figure 2:
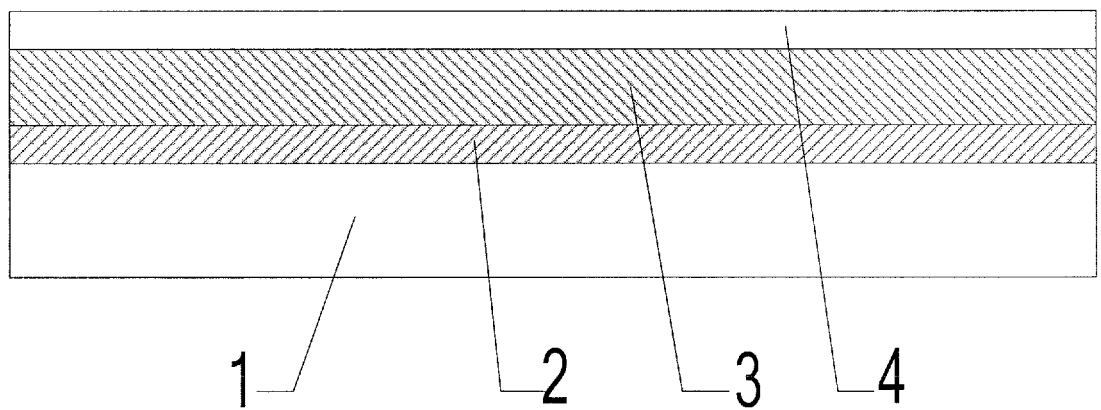
FIGS. 2 to 13 are the first to the twelfth schematic views showing a process for manufacturing the OTFT array substrate as shown in FIG. 1 provided by the embodiment of the invention.

For example, firstly, the gate metal thin film, the gate insulating thin film and the organic semiconductor thin film are sequentially deposited on the transparent substrate 1 by means of sputtering, and the resultant OTFT array substrate is shown in FIG. 2. Preferably, the thickness of the deposited gate insulating thin film may be 200-400 nm.

Figure 3:
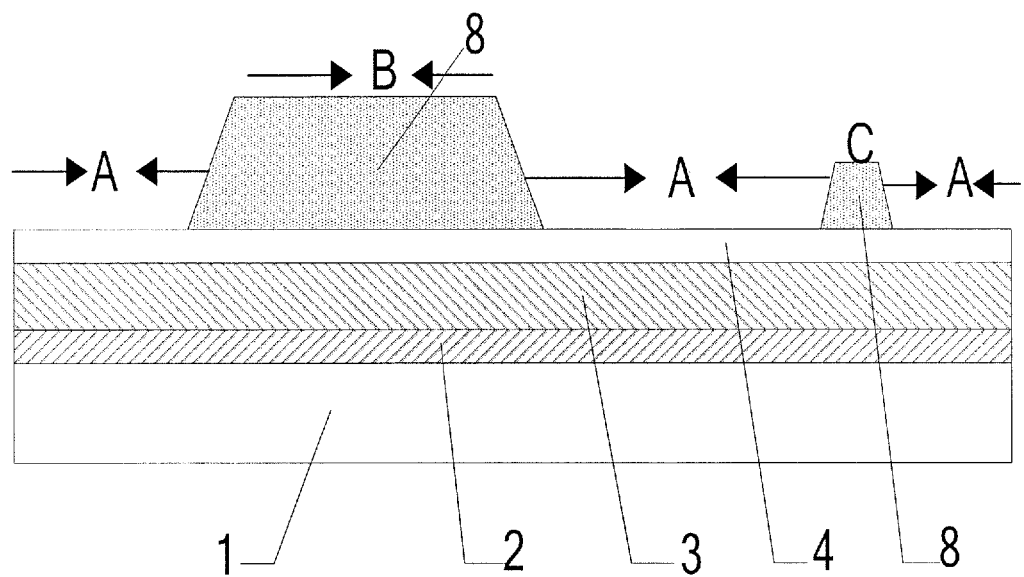

Next, a layer of photoresist 8 is formed by, for example, spin-coating, and the photoresist 8 is exposed with a gray-tone mask plate, and then developed to obtain a photoresist pattern for etching. The resultant OTFT array substrate is shown in FIG. 3. In FIG. 3, the region A is a removed area of photoresist 8, the region B is a photoresist fully-retained area and the region C is a photoresist partially-retained area; during development, the photoresist in the region B is substantially retained, while the photoresist in the region C is partially retained. The fully-retained area of photoresist 8 corresponds to the region in which the pattern of the gate electrode 2 and the active layer 4 are to be formed, and the partially-retained area of photoresist 8 corresponds to the region in which the pattern of the gate line and a common electrode are to be formed.

Figure 4:
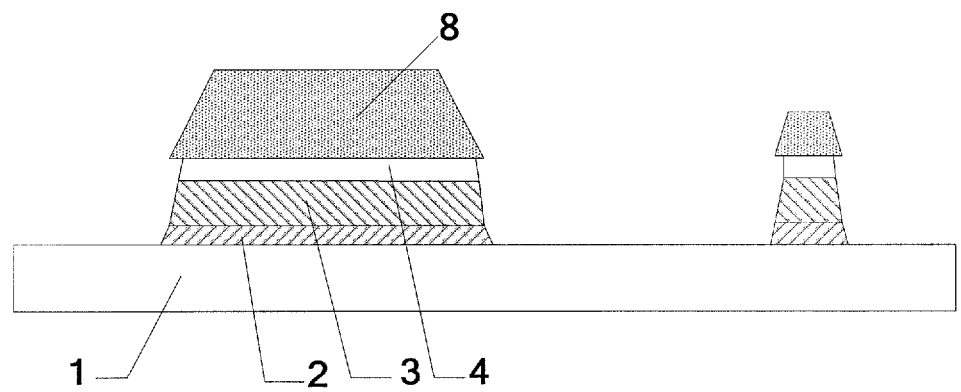
Figure 5:
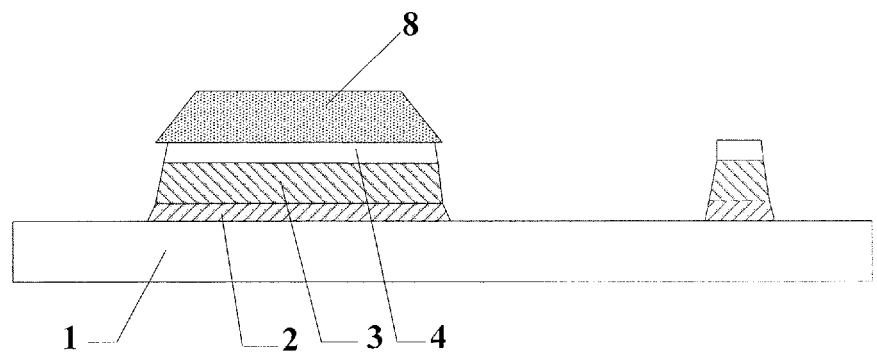
Figure 6:
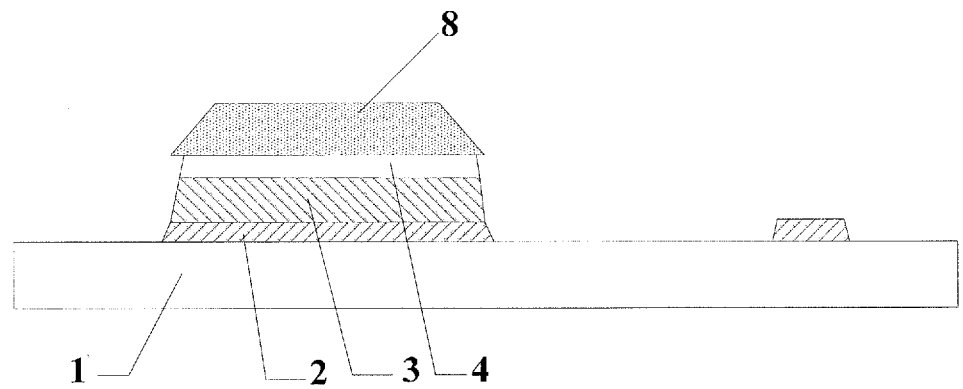
Figure 7:
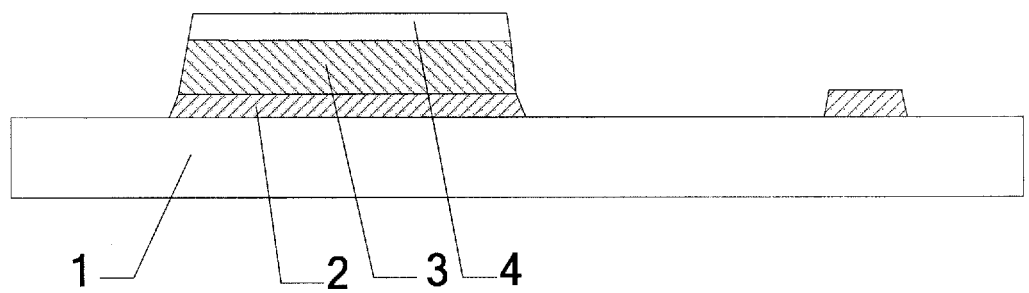

Then, a first etching is conducted on the OTFT array substrate shown in FIG. 3 so as to etch off the gate metal thin film in the fully-removed area of photoresist 8, and the resultant OTFT array substrate is shown in FIG. 4;

Next, an ashing treatment is conducted on the photoresist 8 on the OTFT array substrate shown in FIG. 4, so as to remove the photoresist 8 in the partially-retained area of photoresist 8 and reduce the thickness of the photoresist in the photoresist fully-retained area, and the resultant OTFT array substrate is shown in FIG. 5;

Subsequently, a second etching is then conducted on the OTFT array substrate shown in FIG. 5 to etch off the organic semiconductor thin film and the gate insulating layer thin film in the partially-retained area of photoresist 8, so that the gate line and the common electrode are patterned, and the resultant OTFT array substrate is shown in FIG. 6;

After that, the photoresist 8 in the fully-retained area of photoresist 8 in the OTFT array substrate shown in FIG. 6 is removed, to obtain the OTFT array substrate in the first patterning process according to the embodiment of the invention, as shown in FIG. 7;

Through the first patterning process, the pattern of the gate line and the pattern of the gate electrode, the gate insulating layer and the active layer of the OTFT which are uniform in shape are formed.

A2、 A passivation layer thin film is fabricated on the transparent substrate 1 subjected to the first patterning process, and the pattern of a first passivation layer unit 51 and a second passivation layer unit 52 is formed through a second patterning process; preferably, a thickness of the passivation layer thin film may be 250-650 nm.

Figure 8:
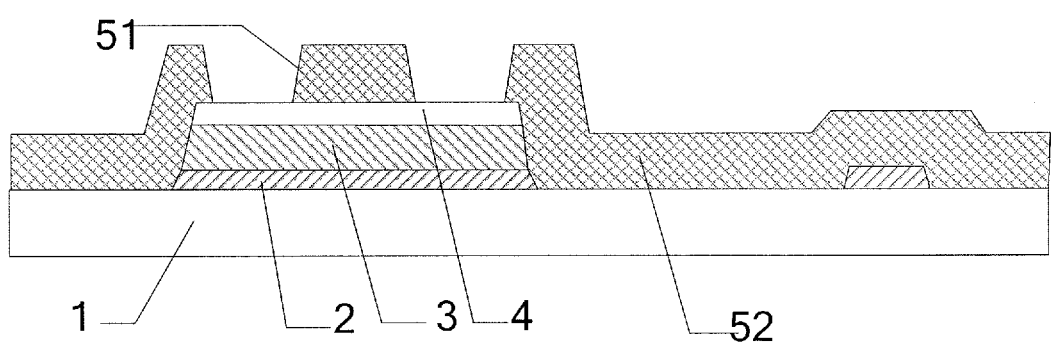

For example, the passivation layer thin film is fabricated on the transparent substrate 1 subjected to the first patterning process by using a spin-coating process, and then subjected to a patterning process including exposure, development, etc., so as to form the pattern of the first passivation layer unit 51 and the second passivation layer unit 52, and the resultant OTFT array substrate is shown in FIG. 8.

A3、 A transparent conductive thin film and a source-drain metal thin film are sequentially deposited on the transparent substrate 1 subjected to the second patterning process, and through a third patterning process, the pattern of a source electrode 9, a drain electrode 7 of the OTFT and a data line 10 is formed with the source-drain metal thin film, and the pattern of a first contact layer unit 61 under the source electrode 9 of the OTFT, a second contact layer unit 63 under the drain electrode 7 of the OTFT, a third contact layer unit 64 under the data line 10, and a pixel electrode 62 which is directly connected to the second contact layer unit 63 is formed with the transparent conductive thin film.

Figure 9:
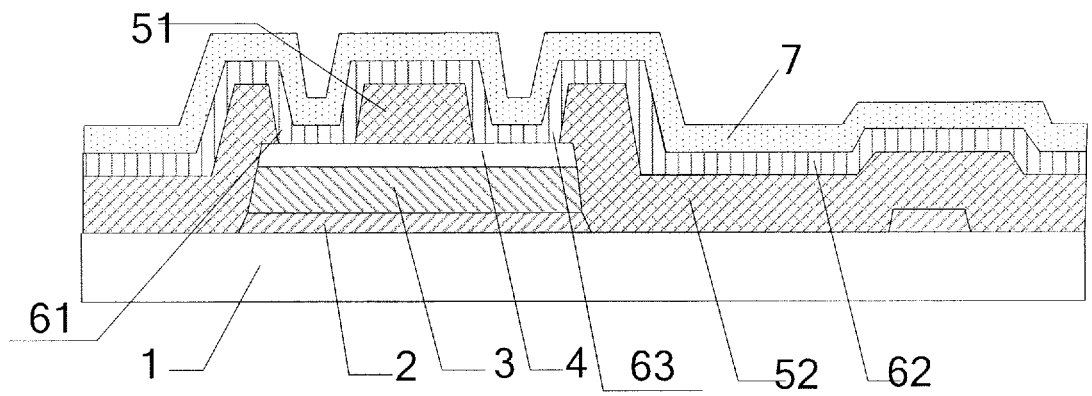

For example, the transparent conductive thin film and the source-drain metal thin film are sequentially deposited on the transparent substrate 1 subjected to the second patterning process, and the resultant OTFT array substrate is shown in FIG. 9; next, a layer of photoresist 8 is spin-coated, and the photoresist 8 is exposed with a gray-tone mask plate, and then developed to obtain a photoresist pattern for a subsequent etch process. The OTFT array substrate subjected to exposure and development is shown in FIG. 10.

Figure 10:
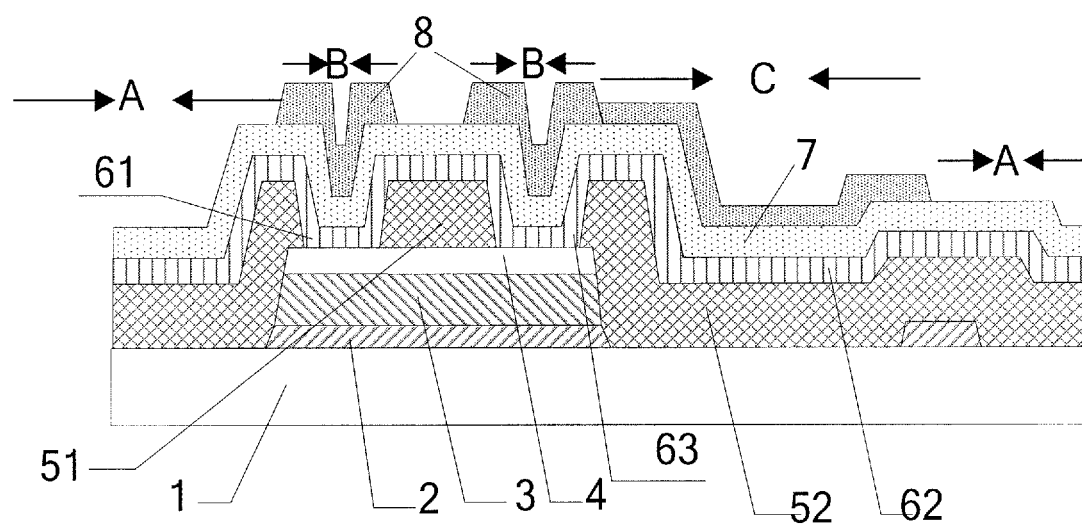

In FIG. 10, in the resultant photoresist pattern, region A is a removed area of photoresist 8, region B is a fully-retained area of photoresist 8 and region C is a partially-retained area of photoresist 8. The fully-retained area of photoresist 8 corresponds to a region in which the pattern of the source electrode 9, the drain electrode 7, the first contact layer unit 61, the second contact layer unit 63, the third contact layer unit 64 and the data line 10 is to be formed, and the partially-retained area of photoresist 8 corresponds to a region in which the pixel electrode is to be formed.

Figure 11:
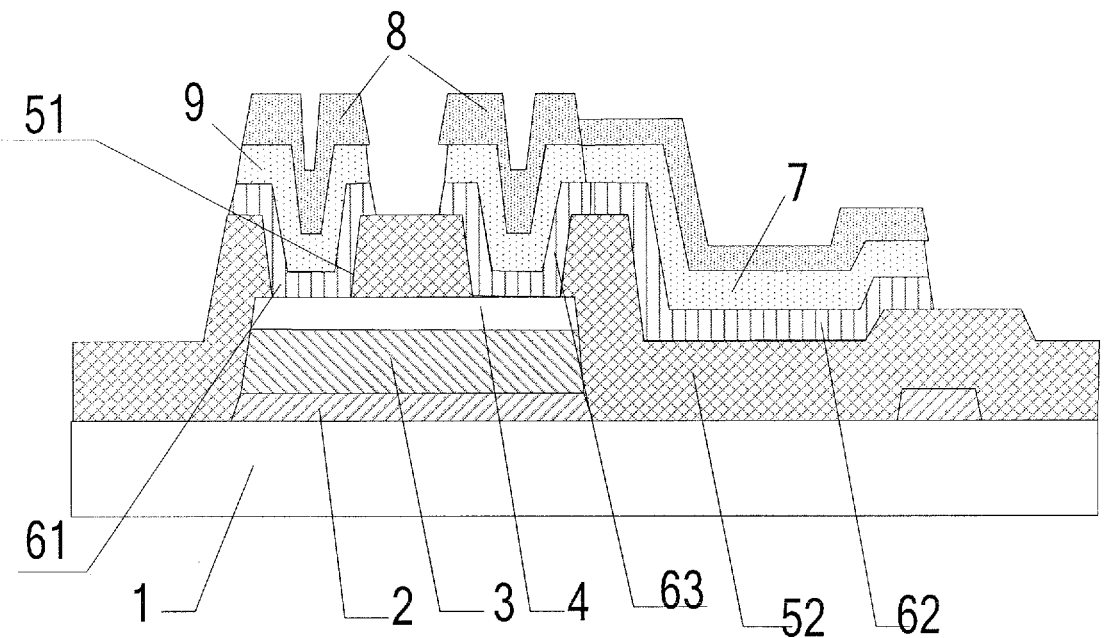
Figure 12:
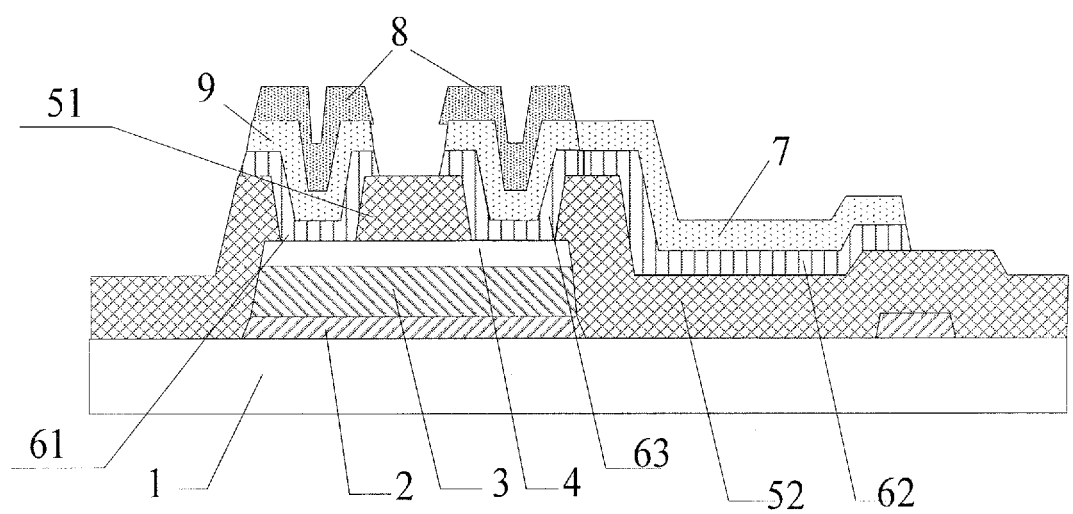
Figure 13:
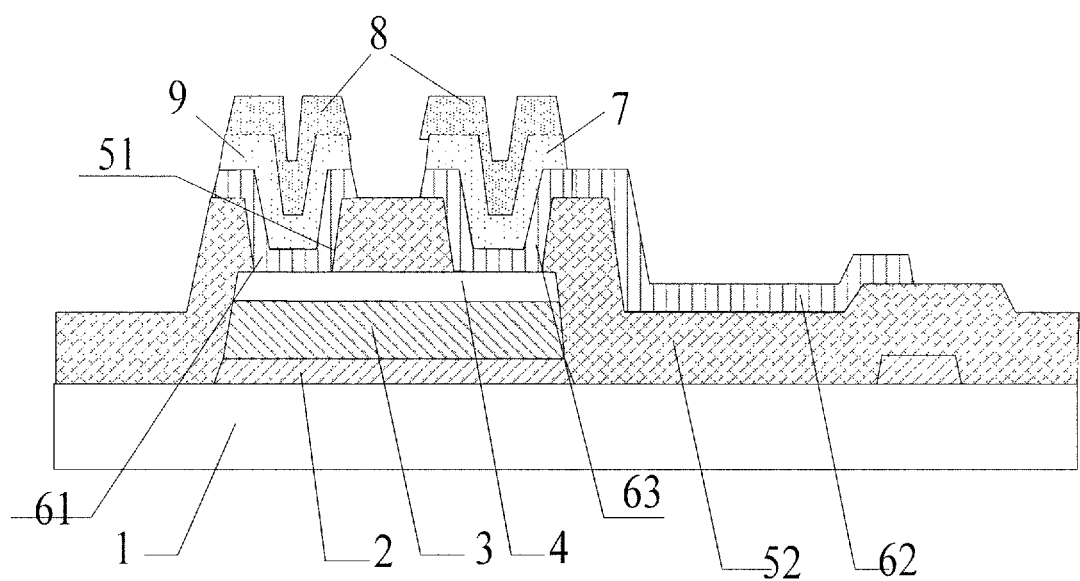

Then, a first etching is conducted on the OTFT array substrate shown in FIG. 10 so as to etch off the source-drain metal thin film and the transparent conductive thin film in the fully-removed area of photoresist 8, and the resultant OTFT array substrate is shown in FIG. 11;

Next, an ashing treatment is conducted on the photoresist 8 on the OTFT array substrate shown in FIG. 11, so as to remove the photoresist 8 in the partially-retained area of photoresist 8 and reduce the thickness of the photoresist in the photoresist fully-retained area, and the resultant OTFT array substrate is shown in FIG. 12;

Then, a second etching is conducted on the OTFT array substrate shown in FIG. 12, so as to etch off the source-drain metal thin film in the partially-retained area of photoresist 8, and the resultant OTFT array substrate is shown in FIG. 13;

Finally, a removal treatment, is performed on the photoresist 8 in the fully-retained area of photoresist 8 in the OTFT array substrate shown in FIG. 13, and the OTFT array substrate after removal is shown in FIG. 1.

Through the third patterning process, the source-drain metal thin film is formed to be the pattern of the source electrode 9, the drain electrode 7 of the OTFT and the data line 10, and the transparent conductive thin film is formed to be the pattern of the first contact layer unit 61 under the source electrode 9 of the OTFT, the second contact layer unit 63 under the drain electrode 7 of the OTFT, the third contact layer unit 64 under the data line 10, and the pixel electrode 62 which is directly connected to the second contact layer unit 63.

According to the embodiment of the invention, there is provided a method for manufacturing an OTFT array substrate, in which, the gate electrode, the gate insulating layer and the active layer are deposited in sequence and patterned in a same patterning process. The OTFT array substrate produced by the above manufacturing method has the first passivation layer unit over the channel region of the active layer of the OTFT. During manufacture and patterning of the conductive thin film, the first passivation layer unit serves to protect the channel region of the active layer, and moreover, the size of the channel region can be controlled precisely with the first passivation layer unit. Thus, the quality of the channel is improved.

The foregoing are merely exemplary embodiments of the invention, but not used to limit the protection scope of the invention. The protection scope of the invention is defined by the attached claims.

The invention claimed is:

1. A manufacturing method of an organic this film transistor (OTFT) array substrate, comprising:
   depositing a gate metal thin film, a gate insulating layer thin film and an organic semiconductor thin film on a transparent substrate sequentially, and forming a pattern including a gate electrode, a gate insulating layer and an active layer of an OTFT which are uniform in shape and a gate line through a first patterning process;
   forming a passivation layer thin film on the transparent substrate subjected to the first patterning process, and forming a pattern of a first passivation layer unit and a second passivation layer unit through a second patterning process;
   depositing a transparent conductive thin film and a source-drain metal thin film sequentially on the transparent substrate subjected to the second patterning process, and through a third patterning process, forming a pattern of a source electrode and a drain electrode of the OTFT and a data line with the source-drain metal thin film, and forming a pattern of a first contact layer unit under the source electrode of the OTFT, a second contact layer unit under the drain electrode of the OTFT, a third contact layer unit under the data line and a pixel electrode which is directly connected to the second contact layer unit with the transparent conductive thin film;
   wherein, on a channel region of the active layer of the OTFT, there is provided the first passivation layer unit;
   wherein the second passivation layer unit at least covers edges of the gate electrode, the gate insulating layer and the active layer of the OTFT which are uniform in shape and is in contact with a top surface of the active layer at edges of the active layer.

2. The manufacturing method claimed as claim 1, wherein a thickness of the gate insulating layer thin film is 200-400 nm.

3. The manufacturing method claimed as claim 1, wherein a thickness of the passivation layer thin film is 250-650 nm.

4. An organic thin film transistor (OTFT) array substrate, comprising:
   a transparent substrate, gate lines and data lines which are formed on the transparent substrate, and a plurality of pixel units which are defined by crossing of the gate lines and the data lines, each of the pixel units comprising an organic thin film transistor (OTFT) and a pixel electrode; wherein, on a channel region of an active layer of the OTFT, there is provided a first passivation layer unit, and a gate electrode, a gate insulating layer and the active layer of the OTFT for are uniform in shape;
   the OTFT array substrate further comprises:
   a second passivation layer unit, which at least covers edges of the gate electrode, the gate insulating layer and the active layer of the OTFT which are uniform in shape, wherein the second passivation layer unit is in contact with a top surface of the active layer at edges of the active layer.

5. The OTFT array substrate claimed as claim 4, wherein a thickness of the gate insulating layer is 200-400 nm.

6. The OTFT array substrate claimed as claim 4, wherein a thickness of the first passivation layer unit is 250-650 nm.

7. A display device, comprising the OTFT array substrate claimed as claim 4.

8. The OTFT array substrate claimed as claim 4, wherein the active layer is made of organic material.

9. The OTFT array substrate claimed as claim 4, wherein the first passivation layer unit and the second passivation layer unit are in different patterns formed by a same layer of thin film.

10. The OTFT array substrate claimed as claim 9, wherein a material for the first passivation layer unit, the second passivation layer unit is an organic photosensitive material.

11. The OTFT array substrate claimed as claim 4, wherein in a non-channel region of the active layer of the OTFT, a source electrode of the OTFT is connected to the active layer through a first contact layer unit under the source electrode, a drain electrode of the OTFT is connected to the active layer through a second contact layer unit under the drain electrode, and under the data lines, there is formed a third contact layer unit.

12. The OTFT array substrate claimed as claim 11, wherein the first contact layer unit, the second contact layer unit, the third contact layer unit and the pixel electrode are in different patterns formed by a same layer of thin film, and the pixel electrode is directly connected to the second contact layer unit.

13. The OTFT array substrate claimed as claim 11, wherein,
   the first contact layer unit under the source electrode of the OTFT has a larger pattern than the source electrode or is uniform in pattern with the source electrode;
   the second contact layer unit under the drain electrode of the OTFT has a larger pattern than the drain electrode or is uniform in pattern with the drain electrode; and
   the third contact layer unit under the data lines of the OTFT has a larger pattern than the data lines or is uniform in pattern with the data lines.

* * * * *